(12) United States Patent
Takahashi

(10) Patent No.: US 6,790,711 B2
(45) Date of Patent: Sep. 14, 2004

(54) METHOD OF MAKING SEMICONDUCTOR DEVICE

(75) Inventor: Yoshiharu Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/663,940

(22) Filed: Sep. 17, 2003

(65) Prior Publication Data

US 2004/0063252 A1 Apr. 1, 2004

Related U.S. Application Data

(62) Division of application No. 09/629,899, filed on Jul. 31, 2000, now Pat. No. 6,650,012.

(51) Int. Cl.$^7$ ............................................. H01L 21/44
(52) U.S. Cl. .................. 438/123; 438/112; 438/691; 438/754; 257/676; 257/690; 257/787
(58) Field of Search ................ 257/676, 690, 257/787; 438/112, 123, 691, 754

(56) References Cited

U.S. PATENT DOCUMENTS

| | | | |
|---|---|---|---|
| 5,389,816 A | | 2/1995 | Shimizu et al. |
| 5,521,430 A | * | 5/1996 | Shibata ........................ 257/676 |
| 5,723,903 A | | 3/1998 | Masuda et al. |
| 6,081,029 A | | 6/2000 | Yamaguchi |
| 6,087,201 A | | 7/2000 | Takahashi et al. |
| 6,159,770 A | * | 12/2000 | Tetaka et al. ................ 438/112 |
| 6,166,430 A | * | 12/2000 | Yamaguchi .................. 257/666 |
| 6,225,146 B1 | * | 5/2001 | Yamaguchi et al. ......... 438/123 |

FOREIGN PATENT DOCUMENTS

| | | |
|---|---|---|
| JP | 59-208756 | 11/1984 |
| JP | 2-240940 | 9/1990 |
| JP | 10-178044 | 6/1998 |
| JP | 11-74404 | 3/1999 |

* cited by examiner

Primary Examiner—David Nelms
Assistant Examiner—Dao H. Nguyen
(74) Attorney, Agent, or Firm—Leydig, Voit & Mayer, Ltd.

(57) ABSTRACT

A method of manufacturing a semiconductor device using a lead frame composed of a plate-like body having a non-planar upper surface and a planar under surface. The plate-like body includes a first thin portion for mounting a semiconductor chip with pad electrodes, first thick portions radially arranged for forming lead electrodes respectively corresponding to the pad electrodes of the semiconductor chip, a second thin portion between pairs of the first thick portions, a third thin portion peripherally surrounding the first thick portions, and a second thick portion surrounding the third thin portion. The semiconductor chip and the lead electrodes are sealed to the same surface as all of the thin portions with a resin, after making a connection between the pad electrodes and the lead electrodes with connecting wires. The first, second, and third thin portions are removed by etching so that each of the lead electrodes includes a thin internal lead portion having a connection part on an upper surface side and a thick external electrode portion protruding toward an under surface and forming a connection part. The resin at the underside is substantially co-planar with the under surface of the internal lead portion of the lead electrodes, and the external electrode portion protrudes downward from the underside of the resin layer.

4 Claims, 12 Drawing Sheets

METHOD OF MAKING SEMICONDUCTOR DEVICE

This application is a Division of the application Ser. No. 09/629,899, filed Jul. 31, 2000, now U.S. Pat. No. 6,650,012.

BACKGROUND OF THE INVENTION

1. Field of the Invention

The present invention relates to a semiconductor device and a manufacturing method thereof, and more particularly, relates to a semiconductor device using a lead frame as a wiring base member and a manufacturing method thereof.

2. Description of the Background Art

Under the background of high density integration of semiconductor chins, it has been increasingly popular to use a ball grid array (hereinafter referred to as BGA) type semiconductor device in which an external lead is arranged over a surface. Generally, in the BGA type semiconductor device, a printed circuit board as a wiring base is popularly used. Since such a convention BGA type semiconductor device is, however, high-priced, a BGA type semiconductor device using a low-priced lead frame as a wiring base member has been practically used.

A semiconductor device using a conventional lead frame as a wiring base member is hereinafter described with reference to the accompanying drawings. FIG. 11A is a sectional view showing a construction of a conventional BGA type semiconductor device disclosed in the Japanese Laid-Open Patent Publication (unexamined) No. Hei 11-74404, and FIG. 11B is a bottom view of the semiconductor device shown in FIG. 11A. FIG. 12A is a plan view showing a lead frame used in the convention BGA type semiconductor device and arranged in a single line. FIG. 12B is a sectional view taken along the line XIIb—XIIb indicated by the arrows in FIG. 12A. FIG. 12C is a sectional view taken along the line XIIc—XIIc indicated by the arrows in FIG. 12A.

In FIGS. 11A, 11B, 12A, 12B and 12C, the conventional BGA type semiconductor device uses a lead frame 50 as a wiring base member, and a semiconductor chip 1 provided with a pad electrode is mounted on a die pad 2 with a junction material 3. The semiconductor device has solder ball mounting portion (hereinafter referred to as external electrode portion) 4. A lead electrode 5, of which an inside end portion is radially arranged the die pad 2, and a pad electrode of the semiconductor chip 1 are connected to each other through a connection lead 6 and sealed with a resin layer 7. Portions 4a and 4b continued underneath the lead electrode 5 are made thin by etching except the external electrode portion 4. Accordingly, the die pad 2, the external electrode portion 4 and a suspension lead 8 for supporting the die pad 2 are exposed on the same surface as the under surface of the seal resin layer 7. A solder ball 9 is mounted on the external electrode portion 4, and an end of the lead electrode 5 and that of the suspension lead 8 are finally cut along the resin seal line 7a.

A manufacturing method is hereinafter described with reference to FIGS. 11 to 13. FIGS. 13A, 13B and 13C are explanatory views showing a manufacturing method of the conventional BGA type semiconductor device. FIG. 13A is a sectional view of the lead frame shown in FIG. 12C. FIG. 13B is a sectional view showing molds applied at the time of sealing with the seal resin layer. FIG. 13C is a sectional view showing an assembling step before mounting of the soldering ball has been completed.

First, the lead frame 50 shown in FIGS. 12A, 12B and 12C is manufactured. More specifically, after forming a resist film on the upper surface 50a and the under surface 50b of the lead frame 50 and patterning it, as shown in FIG. 12A the lead frame is etched from the upper surface 50a and the under surface 50b. Thus, the die pad 2, the external electrode portion 4, the lead electrode 5, the suspension lead 8 and a dam bar 50c are formed to continue across openings 50d and 50e. Then, after forming a resist film on the under surface 50b of the lead frame 50, except the portions 4a and 4b on the underside of the lead electrode 5, the portions 4a and 4b are formed by half etching.

Subsequently, the semiconductor chip 1 provided with the pad electrode is mounted on the die pad 2 by applying the junction material 3. The pad electrode of the semiconductor chip 1 and the inside end of the electrode 5 are then connected through the connection lead 6. Then, as shown in FIG. 13B, after mounting a lower mold 10 in contact with the die pad 2 and the external electrode portion 4, an upper mold 11 is positioned on the resin seal line 7A and mounted on the upper surface of the lead frame 50. After tightening the two molds 10 and 11, the semiconductor chip 1, the die pad 2, the lead electrode 5 and the connecting lead 6 are sealed with the seal resin layer 7 by transfer molding. Thereafter, when removing the upper mold 11 and the lower mold 10, a non lead type semiconductor devices before mounting the solder ball 9, is obtained as shown in FIG. 13C.

Then, by applying a soldering paste to the external electrode portion 4, the solder ball 9 is mounted on the external electrode potion 4. When the lead electrode 5 protruding from the resin sealing line 7a, and the seal resin layer 7 getting into the underside portions 4a and 4b of the lead electrode 5, made thin by half etching, are cut along the resin seal line 7a with a cutter, the conventional BGA type semiconductor device shown in FIGS. 11A and 11B is obtained.

In the mentioned semiconductor device using the conventional lead frame as the wiring base member, since the die pad 2, the external electrode portion 4, the lead electrode 5, the suspension lead 8 and dam bar 50c continue across the openings 50d and 50e, when sealed with the seal resin layer 7 after mounting the two molds 10 and 11, the molten resin, having a low viscosity, also flows into the opening portion 50d. As a result, there has been a problem that the molten resin intrudes into a small space between contact surfaces, where the die pad 2, the external electrode portion 4, the suspension lead 8 are in contact with the lower mold 10, and comes to form a thin resin film (hereinafter referred to as thin burr).

It is certainly possible to prevent the formation of the thin burr between the external electrode portion 4 and the lower mold 10 if a contact pressure between the external electrode portion 4 and the lower mold 10 is large. However, the lead electrode 5 is made thin by etching and supported like a cantilever at a part held between the lower mold 10 and the upper mold 11 at the position of the resin seal line 7a. Therefore, if the external electrode portion 4 is pressed by the lower mold 10, the lead electrode 5 is deformed by the pressure. As a result, it has been heretofore impossible to secure a contact pressure preventing the formation of the thin burr between the external electrode portion 4 and the lower mold 10.

The formation of the thin burr varies depending on the degree of roughness in surface finishing (hereinafter referred to as surface roughness) of the contact surface where the die pad 2 and the external electrode portion 4 are in contact with the lower mold 10. Generally, the thin burr does not adhere to any die or mold having good surface roughness, but adheres to the die pad 2, the external electrode portion 4, etc. having poor surface roughness. Therefore, it is necessary to remove the thin burr adhered, for example, to the external electrode portion 4. To remove the thin burr, hydraulic pressure trimming, chemical trimming, chemical and hydraulic pressure trimming, etc. are performed, and after removing the thin burr, it is necessary to perform treatments such as washing, drying, etc., and as a result manufacturing cost is high.

There has been another problem with the lead electrode 5 protruding from the resin seal line 7a, the seal resin layer 7 gets into the portions 4a and 4b made thin by half etching, and the suspension lead 8, cut using a cutter along the resin seal line 7a. Therefore, it is easy to cause a failure in cutting the portion of the seal resin layer 7 in the portion 4b. As a result, the resin seal line 7a is not linear but has a complicated crushed configuration, resulting in a defective product.

Moreover, as the semiconductor chip 1, the die pad 2, the junction material 3, the lead electrode 5 and the seal resin layer 7 forming the semiconductor device are different in their coefficient of linear expansion, so a curvature is produced due to thermal deformation at the time of manufacturing the semiconductor device.

As a result, there has been a further problem when the non lead type semiconductor device is mounted on an other board, the external electrode portion is inclined and any desirable contact surface is not achieved in the electrical connection with the other board.

SUMMARY OF THE INVENTION

The present invention has been made to solve the above-discussed problems and has an object of providing a novel semiconductor device capable of preventing the formation of thin burr on a surface in contact with a lower mold, for example, between a die pad or an external electrode portion and the lower mold.

Another object of the present invention is to provide a novel semiconductor device capable of preventing a cutout portion of a seal resin layer of the semiconductor device from being a complicated crushed configuration.

A further object of the present invention is to provide a novel semiconductor device capable of achieving a desirable contact surface in electrical connection between an external electrode portion and other board at a time of mounting the semiconductor device on the other board, even if a curvature is produced due to thermal deformation of the semiconductor device.

A novel semiconductor device in a first aspect of the invention includes: a semiconductor chip provided with an upper surface and an under surface and having a plurality of pad electrodes; a plurality of lead electrodes arranged corresponding to the plurality of pad electrodes and extending peripherally on the under surface side of the semiconductor chip; connecting means for connection between the plurality of pad electrodes and the plurality of lead electrodes; a seal resin layer for sealing integrally the semiconductor chip, the lead electrodes and the connecting means; in which each of the plurality of lead electrodes includes a thin internal lead portion having a connection part with the connecting means on the upper surface side, and a thick external electrode portion protruding toward the under surface side to form a connection part to outside; the seal resin layer has an underside which forms substantially the same surface as the under surface of the internal lead portion of the lead electrodes, and the external electrode portion protrudes downward from the underside of the seal resin layer.

In the semiconductor device of above construction, since the external electrode portion protrudes downward from the seal resin layer, even if a curvature is produced due to difference in coefficient of thermal expansion of the components of the semiconductor device, it is possible to achieve a desirable contact surface in the electrical connection between the external electrode portion and other board.

It is preferable that the semiconductor device includes: a semiconductor chip provided with an upper surface and an under surface and having a plurality of pad electrodes; a plurality of lead electrodes arranged corresponding to the plurality of pad electrodes and extending peripherally on the under surface side of the semiconductor chip; connecting means for connection between the plurality of pad electrodes and the plurality of lead electrodes; an auxiliary electrode provided around the plurality of lead electrodes; a seal resin layer for sealing integrally the semiconductor chip, the lead electrodes, the connecting means and the auxiliary electrode; in which each of the plurality of lead electrodes includes a thin internal lead portion having a connection part with the connecting means on the upper surface side, and a thick external electrode portion protruding toward the under surface side to form a connection part to outside; the seal resin layer has an underside which forms substantially the same surface as the under surface of the internal lead portion of the lead electrodes and the auxiliary electrode, and the external electrode portion protrudes downward from the underside of the seal resin layer.

In the semiconductor device of above construction, since the external electrode portion protrudes downward from the seal resin layer, even if a curvature is produced due to difference in coefficient of thermal expansion of the components of the semiconductor device, it is possible to achieve a desirable contact surface in the electrical connection between the external electrode portion and any other board.

A method of manufacturing a semiconductor device in a second aspect of the invention includes the steps of: using a lead frame composed of a plate-like body having an uneven upper surface and a plain under surface, the plate-like body including a first thin portion for mounting a semiconductor chip provided with a plurality of pad electrodes, a plurality of first thick portions provided around the first thin portion for forming lead electrodes respectively arranged corresponding to the pad electrodes of the semiconductor chip, a second thin portion provided between the plurality of first thick portions, a third thin portion provided for surrounding the plurality of first thick portions, and a second thick portion provided around the third thin portion; sealing integrally the semiconductor chip, the lead electrodes and connecting means up to the same surface as that of all thin portions with a seal resin layer, after making a connection between the plurality of pad electrodes of the semiconductor chip mounted on the first thin portion and the plurality of lead electrodes by the connecting means; and removing the first, second and third thin portions by etching so that each of the plurality of lead electrodes includes a thin internal lead portion having a connection part to the connecting means on the upper surface side and a thick external electrode portion protruding toward the under surface and forming a connection part to outside; in which the seal resin layer is formed so that the underside thereof forms substantially the same surface as the under surface of the internal lead portion of the lead electrodes, and that the external electrode portion protrudes downward from the underside of the seal resin layer.

In the semiconductor device manufactured as described above, since the external electrode portion protrudes downward from the seal resin layer, even if a curvature is produced due to difference in coefficient of thermal expansion of the components of the semiconductor device, it is possible to achieve a desirable contact surface in the electrical connection between the external electrode portion and other board.

It is also possible to form a concave part on the upper surface of the lead frame in the first, second and third thin portions. By removing the first, second and third thin portions by etching, the peripheral portion of the concave part lies in a line with the peripheral portion of the semiconductor device including the semiconductor chip, lead electrodes, seal resin layer, etc. provided in the concave part. Under such a condition, by pushing the semiconductor device from the under surface side of the lead frame, it is possible to separate easily the lead frame from the semiconductor device without using any cutter. It is further possible to prevent the separated portion between the lead frame and the semiconductor device from being a complicated crushed configuration.

It is preferable that the first, second and third thin portions have substantially the same thickness. As a result of such construction, the under surface side of the lead frame can be formed into an integrated one component over the first, second and third thin portions. Therefore, the under surface side of the lead frame comes in full contact with a lower mold. When sealing with the seal resin layer, the seal resin layer is shut off by the first, second and third thin portions. Consequently, there is no seal resin layer flowing in the portion where the under surface of the lead frame and the lower mold are in contact with each other, and it is possible to prevent the formation of thin burr.

It is further preferable that the method of manufacturing a semiconductor device includes the steps of: using a lead frame composed of a plate-like body having an uneven upper surface and a plain under surface, the plate-like body including a first thin portion for mounting a semiconductor chip provided with a plurality of pad electrodes, a plurality of first thick portions provided around the first thin portion for forming lead electrodes respectively arranged corresponding to the pad electrodes of the semiconductor chip, a second thin portion provided between the plurality of first thick portions, a third thin portion provided for surrounding the plurality of first thick portions, a second thick portion provided around the third thin portion to form an auxiliary electrode, a fourth thin portion provided around the second thick portion, and a third thick portion provided around the fourth thin portion; sealing integrally the semiconductor chip, the lead electrodes, the connecting means and the auxiliary electrode up to the same surface as that of all of the thin portions with a seal resin layer, after making a connection between the plurality of pad electrodes of the semiconductor chip mounted on the first thin portion and the plurality of lead electrodes by the connecting means and making a connection between the lead electrodes and the auxiliary electrode; and removing the first, second, third and fourth thin portions by etching so that each of the plurality of lead electrodes includes a thin internal lead portion having a connection part to the connecting means on the upper surface side and a thick external electrode portion protruding toward the under surface and forming a connection part to outside; in which the seal resin layer is formed so that the underside thereof forms substantially the same surface as the under surface of the internal lead portion of the lead electrodes and the auxiliary electrode, and that the external electrode portion protrudes downward from the underside of the seal resin layer.

In the semiconductor device manufactured as described above, since the external electrode portion protrudes downward from the seal resin layer, even if a curvature is produced due to difference in coefficient of thermal expansion of the components of the semiconductor device, it is possible to achieve a desirable contact surface in the electrical connection between the external electrode portion and other board.

It is also possible to form a concave part on the upper surface of the lead frame in the first, second and third thin portions, and to arrange the second thick portion provided to form the auxiliary electrode around the concave part. By removing the first, second, third and fourth thin portions by etching, the semiconductor device including the semiconductor chip, lead electrodes, seal resin layer, etc. provided in the concave part is separated from the lead frame at the peripheral portion of the semiconductor device. As a result, it is possible to separate inevitably the lead frame from the semiconductor device without using any cutter. It is further possible to prevent the separated portion between the lead frame and the semiconductor device from being a complicated crushed configuration.

It is further preferable that the first, second, third and fourth thin portions have substantially the same thickness. As a result of such construction, the under surface side of the lead frame can be formed into an integrated one component over the first, second, third and fourth thin portions. Accordingly, in the manufacture of the semiconductor device using the lead frame as a wiring base member, the under surface side of the lead frame can be formed into an integrated one component over the first, second, third and fourth thin portions. Therefore, in the manufacture of the semiconductor device using the lead frame as a wiring base member, the under surface side of the lead frame comes in full contact with a lower mold and seals with the seal resin layer. When sealing With resin layer is shut off by the first, second, third and fourth thin portions. Consequently, there is no seal resin layer flowing in the portion where the under surface of the lead frame and the lower mold are in contact with each other, and it is possible to prevent the formation of thin burr.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A is a sectional view showing a state that a semiconductor chip mounted on the lead frame formed with a thin portion and a lead electrode is electrically connected to the lead electrode. FIG. 3B is a sectional view showing a state that an upper mold and a lower mold are applied to seal with a resin. FIG. 3C is a sectional view showing a state that a resist film for etching is applied to form an external electrode portion. FIG. 3D is a sectional view showing a state that the external electrode portion is protruded by etching. FIG. 3E is a sectional view showing a state that a conductive ball is mounted on the external electrode portion.

FIG. 10A is a sectional view showing a state that a semiconductor chip mounted on the lead frame formed with a thin portion and a lead electrode is electrically connected to the lead electrode. FIG. 10B is a sectional view showing a state that an upper mold and a lower mold are applied to seal with a resin. FIG. 10C is a sectional view showing a state that a resist film for etching is applied to form an external electrode portion. FIG. 10D is a sectional view showing a state that the external electrode portion is protruded by etching.

FIG. 13A is a sectional view of the lead frame shown in FIG. 12C. FIG. 13B is a sectional view showing a state that molds are applied at the time of sealing with the seal resin layer. FIG. 13C is a sectional view showing a state that an assembling step before mounting the soldering ball has completed.

DETAILED DESCRIPTION OF THE PREFERRED EMBODIMENTS

A semiconductor device according to a first-preferred embodiment of the present invention and a manufacturing method thereof are hereinafter described.

Figure 1A:
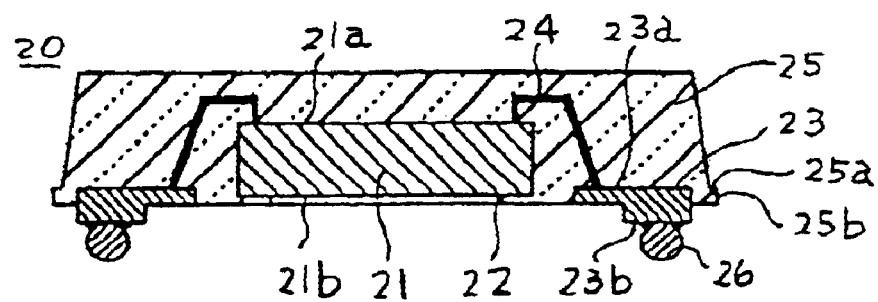
FIG. 1A is a sectional view showing a construction of a semiconductor device according to a first preferred embodiment of the present invention.
Figure 1B:
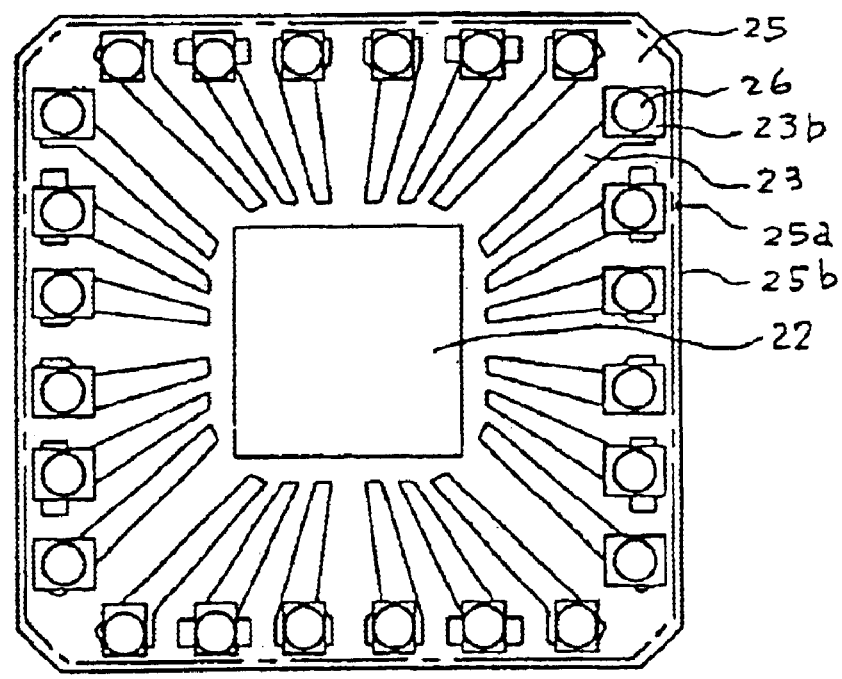
FIG. 1B is a bottom view of the semiconductor device shown in FIG. 1A.
Figure 2A:
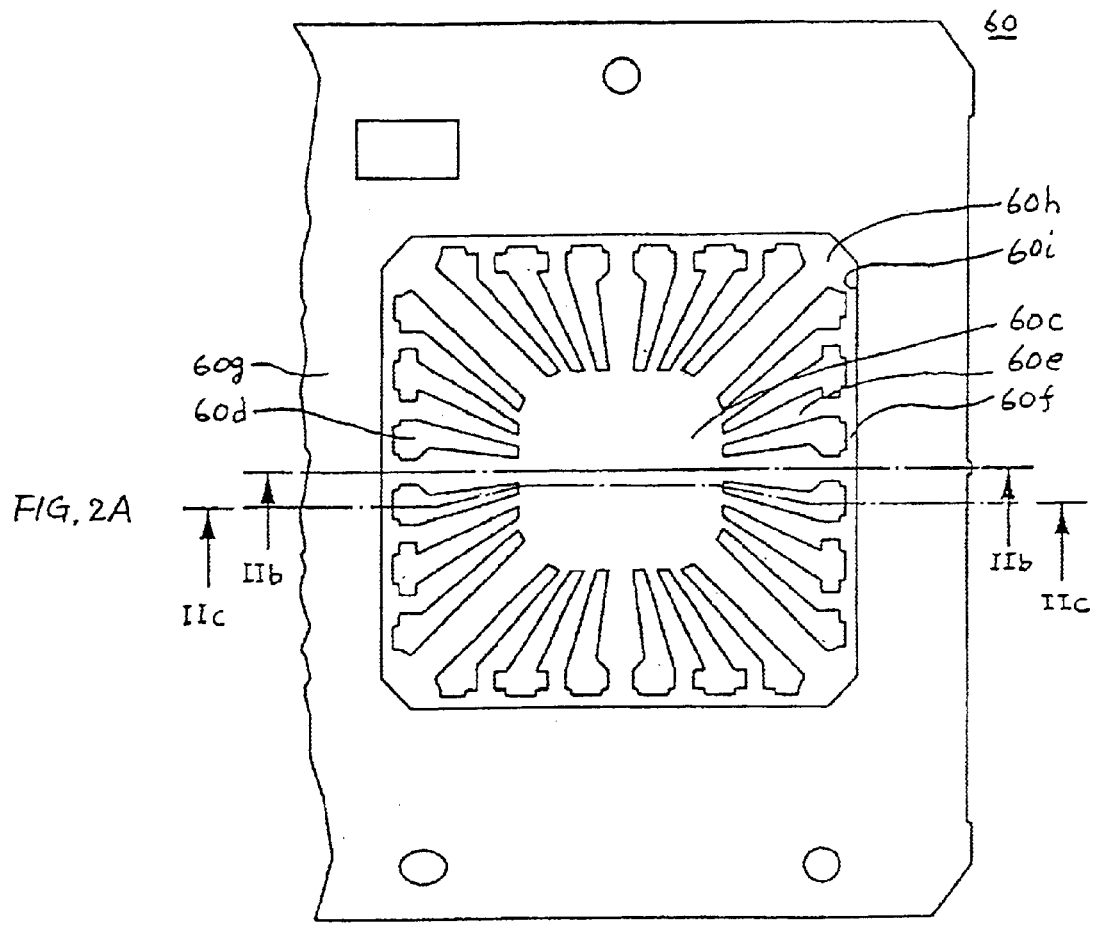
FIG. 2A is a plan view of lead frames arranged in a single line and used as a wiring base member according to the first preferred embodiment of the present invention.
Figure 2B:
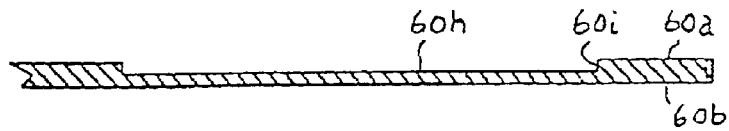
FIG. 2B is a sectional view taken along the line IIb—IIb indicated by the arrows in FIG. 2A.
Figure 2C:
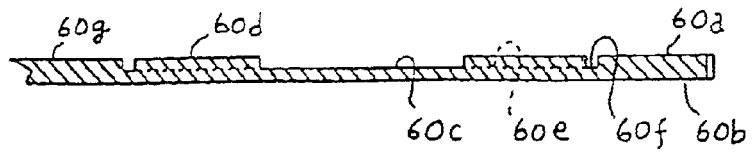
FIG. 2C is a sectional view taken along the line IIc—IIc indicated by the arrows in FIG. 2A.

FIG. 1A is a sectional view showing a construction of a semiconductor device, and FIG. 1B is a bottom view of the semiconductor device shown in FIG. 1A. FIG. 2A is a plan view of a lead frame arranged in a single line and used as a wiring base member according to this first preferred embodiment. FIG. 2B is a sectional view taken along the line IIb—IIb indicated by the arrows in FIG. 2A. FIG. 2C is a sectional view taken along the line IIc—IIc indicated by the arrows in FIG. 2A.

Configuration of a lead frame 60 is hereafter described. As shown in FIGS. 2A, 2B and 2C, the lead frame 60 is composed of a conductive plate-like body such as copper and having an non planar upper surface 60a and a planar under surface 60b. This plate-like body includes a first thin portion 60c for mounting a semiconductor chip 21 provided with a plurality of pad electrodes, a plurality of first thick portions 60d radially arranged around the first thin portion 60c for forming lead electrodes 23 respectively corresponding to the pad electrodes of the semiconductor chip 21, a second thin portion 60e provided between pairs of the plurality of first thick portions 60d, a third thin portion 60f surrounding the plurality of first thick portions 60d, a second thick portion 60g surrounding the third portion 60f. Further, the first thin portion 60c, the second thin portion 60e and the third thin portion 60f have substantially the same thickness. Those thin portions 60c, 60e and 60f form a concave part 60h having a peripheral portion 60i. The thick portions 60d and 60g form a projecting part.

Using such a lead frame 60, a semiconductor device 20 shown in FIGS. 1A and 1B is obtained. The semiconductor device 20 has an upper surface 21a and an under surface 21b, and the semiconductor chip 21 having the plurality of pad electrodes is mounted on the first thin portion 60c of the lead frame 60 with a junction member 22. The plurality of lead electrodes 23 extending peripherally on the under surface 21b side of the semiconductor chip 21 correspond to the plurality of pad electrodes. A connecting lead 24 serving as connecting means makes a connection between the plurality of pad electrodes and the plurality of lead electrodes 23. Each of the plurality of lead electrodes 23 includes a thin internal lead portion 23a having a connection part for the connecting lead 24 on the upper surface side, and a thick external electrode portion 23b protruding toward the under surface and forming a connection part to outside.

The semiconductor chip 21, the lead electrodes 23 and the connecting lead 24 are integrally sealed with a seal resin layer 25. This seal resin layer 25 has an underside which forms substantially the same surface as the under surface of the internal lead portion 23a of the lead electrodes 23, and the external electrode portion 23b protrudes downward from the underside of the seal resin layer. A conductive ball 26 is mounted on the external electrode portion 23b.

In the lead frame 60 not shown, the thin portion of the lead frame is removed by etching as described hereinafter, and finally the lead frame 60 is separated along the peripheral portion 60i of the concave part 60h of the lead frame 60.

Thus, the semiconductor device 20 shown in FIGS. 1A and 1B is obtained.

Figure 3A:
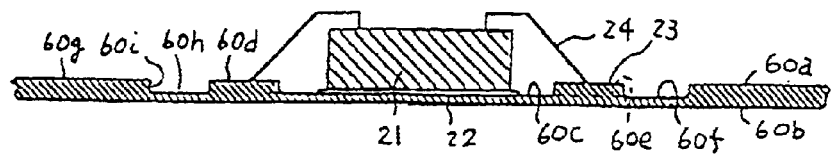
FIGS. 3A to 3E are explanatory views showing a manufacturing method of the semiconductor device according to the first preferred embodiment of the present invention.
Figure 3B:
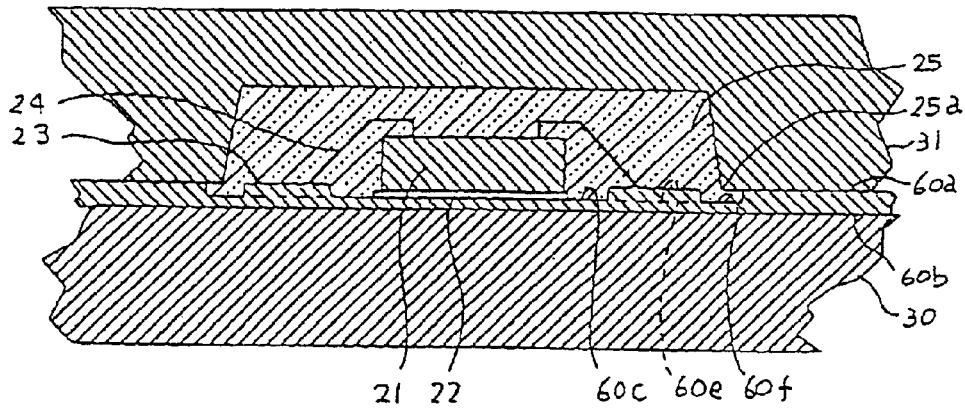
Figure 3C:
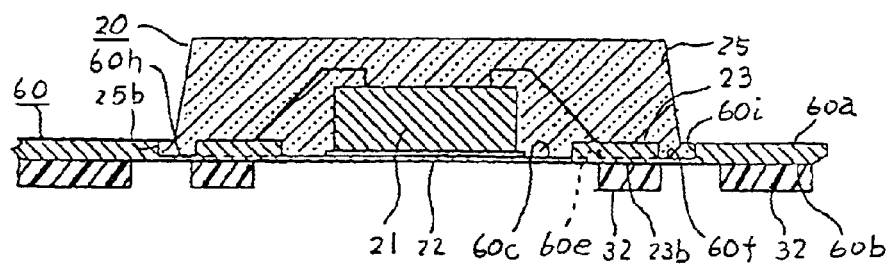
Figure 3D:
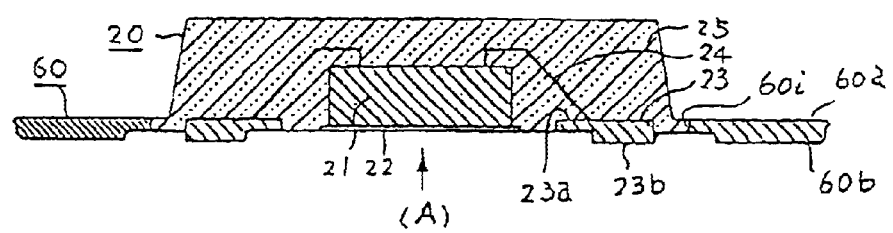
Figure 3E:
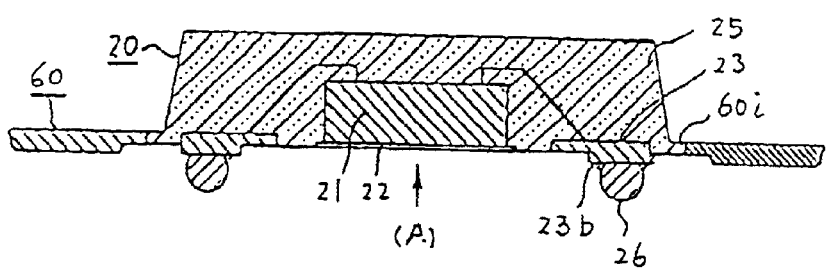

Now, a method of manufacturing the semiconductor device is described with reference to FIGS. 1A to 3E. FIGS. 3A to 3E are explanatory views showing a manufacturing method of the semiconductor device according to the first preferred embodiment of the present invention. FIG. 3A is a sectional view showing a semiconductor chip mounted on the lead frame formed with a thin portion and a lead electrode electrically connected to the lead electrode. FIG. 3B is a sectional view showing an upper mold and a lower mold applied to seal with a resin layer. FIG. 3C is a sectional view showing a resist film for etching is applied to form an external electrode portion. FIG. 3D is a sectional view showing the external electrode portion made protruding by etching. FIG. 3E is a sectional view showing a conductive ball is mounted on the external electrode portion.

First, by half etching the upper surface 60a of the lead frame 60, after forming a resist film not shown and patterning it as shown in FIG. 2A, a plate-like body provided with the non-planar upper surface 60a and the planar, under surface 60b is formed. More specifically, the first thin portion 60c for mounting the semiconductor chip 21 provided with the plurality of pad electrodes, the plurality of first thick portions 60d radially arranged around the first thin portion 60c for forming the lead electrodes 23 respectively corresponding to the pad electrodes of the semiconductor chip 21, the second thin portion 60e provided between pairs of the plurality of first thick portions 60d, the third thin portion 60f peripherally surrounding the plurality of first thick portions 60d, and the second thick portion 60g surrounding the third thin portion 60f are formed.

Further, the first thin portion 60c, the second thin portion 60e and the third thin portion 60f have substantially the same thickness, and those thin portions 60c, 60e and 60f form the concave part 60h. The thick portions 60d and 60g form the projecting part. Thus, the plate-like body provided with the non-planar upper surface 60a and the planar under surface 60b is formed.

In the sectional form of the peripheral portion 60i of the concave part 60h formed in the direction of thickness by etching, a smooth surface is naturally formed, spreading out a little from the third thin portion 60f toward the upper surface 60a of the lead frame due to side etching peculiar to this etching. As a result, it becomes easy to separate the peripheral portion 25b of a later-described seal resin layer 25 from the peripheral portion 60i of the concave part 60h of the lead frame 60.

The peripheral portion 60i may be either larger than a resin seal line 25a, for example, larger by a depth of the concave part 60h or coincident with the resin seal line 25a, so that a later-described upper mold 31 is easily positioned.

Then, as shown in FIG. 3A, by applying a junction material 22 composed of epoxy resin, epoxy resin with silver, adhesive tape, solder or the like to the central part of the first thin portion 60c, the semiconductor chin 21 is mounted (junction step).

Then, as shown in FIG. 3B, the under surface 60b of the lead frame 60 for which the junction step and the connection step have been completed is mounted on the lower mold 30. Then, the upper mold 31 is positioned to the resin seal line 25a and mounted on the upper surface 60a of the lead frame 60. After tightening the two molds 30 and 31, the thermosetting seal resin layer 25 composed of epoxy resin, phenol resin or the like is transformed to a liquid of a low viscosity and injected with a high pressure by transfer molding (sealing step).

At this time, the under surface 60b side of the lead frame 60 being integrated with the thin portions 60c, 60e and 60f comes entirely in contact with the lower mold 30, and the seal resin layer 25 is blocked by the thin portions 60c, 60e and 60f. Therefore, the seal resin layer 25 does not flow in the contact surface between the under surface 60b of the lead frame 60 and the lower mold 30. As a result, it is possible to prevent formation of a thin burr.

After the sealing step, the two molds 30 and 31 are removed. As shown in FIG. 3C, on the under surface 60b of the lead frame 60, a resist film 32 is applied to a part where the external electrode portion 23b is formed and to a part surrounding the outside of the peripheral portion 60i of the concave part 60h. Then the under surface 60b of the lead frame 60, except the portions covered with the resin film 32, is removed by half etching up to the same surface as the under surface of the seal resin layer 25. As a result, as shown in FIG. 3D, the junction material 22 is exposed, and the plurality of lead electrodes 23 protrude respectively toward the under surface. Thus, the thick external electrode portion 23b serving as a connection part is formed on the underside of the lead electrodes 23 (formation step of external electrode portion).

That is, the semiconductor chip 21, the lead electrodes 23 and the connecting lead 24 are integrally sealed with the seal resin layer 25. This seal resin layer 25 is arranged so that its underside forms substantially the same surface as the under surface of the internal lead portion 23a of the lead electrodes 23, and the external electrode portion 23b protrudes downward from the underside of the seal resin layer 25. The lead frame 60 and the semiconductor device 20 are connected at the area where the peripheral portion 25b of the seal resin layer 25 lies in a line with the peripheral portion 60i of the concave part 60h of the lead frame 60.

Under such a condition, by pushing the semiconductor device 20 in the direction of arrow (A) shown in FIG. 3D, the semiconductor device 20 is separated from the lead frame 60 (separation step). As a result, it is possible to separate easily the semiconductor device 20 and the lead frame 60 without using any cutter, and it is further possible to prevent the separated portion of the seal resin layer 25 of the semiconductor device 20 from having a complicated crushed configuration.

Even if a thin burr is formed in the space between the upper mold 31 and the lead frame 60, the thin burr can be removed in this separation step.

Further, the semiconductor device obtained after this separation step can be used in a thin and small apparatus such as cellular phone to serve as a non lead type semiconductor Further, before the separation step, as shown in FIG. 3E, a soldering paste is applied to the external electrode portion 23b to connect a conductive ball 26, such as soldering ball. Thereafter, by pushing the semiconductor device 20 in the direction of the arrow (A) at the part where the semiconductor device 20 and the peripheral portion 60i of the lead frame 60 are connected, the semiconductor device 20 is separated from the lead frame 60. Thus, a BGA type semiconductor device as show in FIGS, 1A and 1B is obtained.

That is, in this manufacturing method, as a result of using the lead frame 60 as a wiring base member, it is possible to achieve the BGA type semiconductor device by adding the step of mounting the conductive ball before the separation step for obtaining the non lead type semiconductor device. This means that both non lead type semiconductor device and BGA type semiconductor device are obtained in a common manufacturing process, thus it is possible to establish an efficient manufacturing line.

On the under surface side of the semiconductor device 20, the external electrode 23b protrudes downward from the underside of the seal resin layer 25. Therefore, even if a curvature is produced due to difference in coefficients of thermal expansion of the components of the semiconductor device, it is possible to obtain a desirable contact surface in the electrical connection between the external electrode portion 23b and other board.

Even if there is a curvature in the other board, in addition to the curvature produced the semiconductor device 20 itself, the external electrode portion 23b comes exactly into contact with the other board without fail, and there is no insufficient contact. As a result, when incorporating the non lead type semiconductor device in a cellular phone in which the size of semiconductor device is required to be small, it becomes possible to reduce the diameter of soldering ball by 0.45 mm, for example.

Figure 4A:
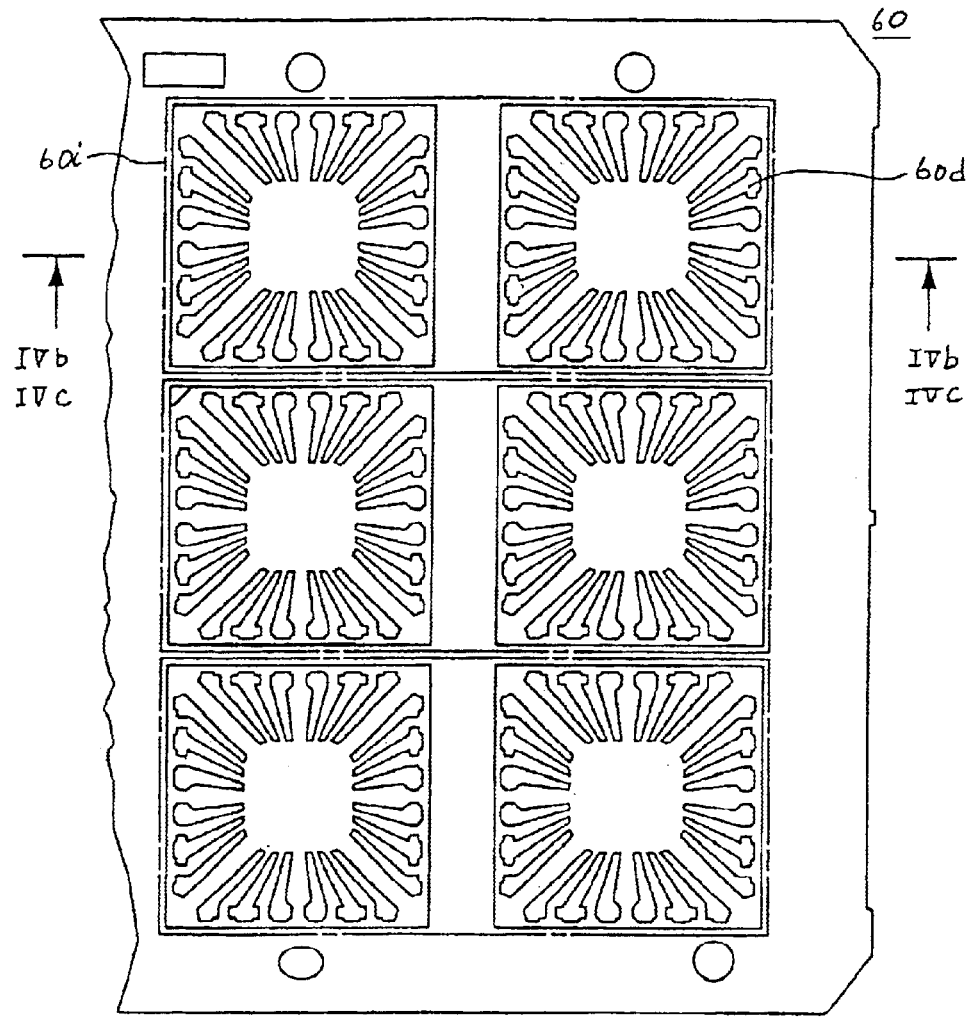
FIG. 4A is a plan view of the lead frame used as another wiring base member according to the first preferred embodiment of the present invention.
Figure 4B:
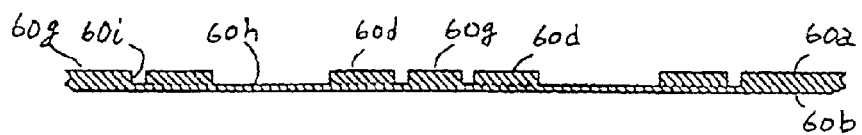
FIGS. 4B and 4C are sectional views taken along the line IVb—IVb indicated by the arrows and the line IVc—IVc indicated by the arrows respectively shown in FIG. 4A.
Figure 4C:
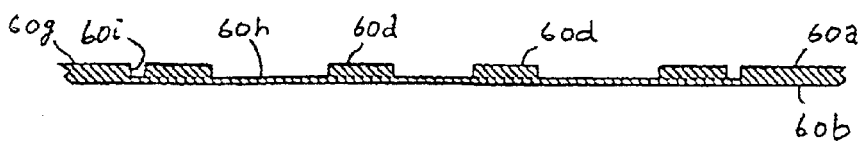

Though an example in which one semiconductor chip 20 is mounted on the lead frame 60 and the lead electrodes 23 are arranged around it, and a plurality of such lead frames are arranged in a single line is described in this embodiment, it is also preferable that, from the viewpoint of efficient manufacture, a plurality of semiconductor chips 21 are mounted in several rows and columns as shown in FIGS. 4A and 4B. In such a modification, the To obtain a so-called multi-chip-package semiconductor device in which two semiconductor chips having the same function and heating value are simultaneously sealed with one resin, it is also preferable that a periphery 601 of the concave part 60h be provided as indicated by one-dot line in FIG. 4A to use a lead frame having a sectional view shown in FIG. 4C. In such a modification, the same function and advantage as the foregoing are also exhibited.

Figure 5A:
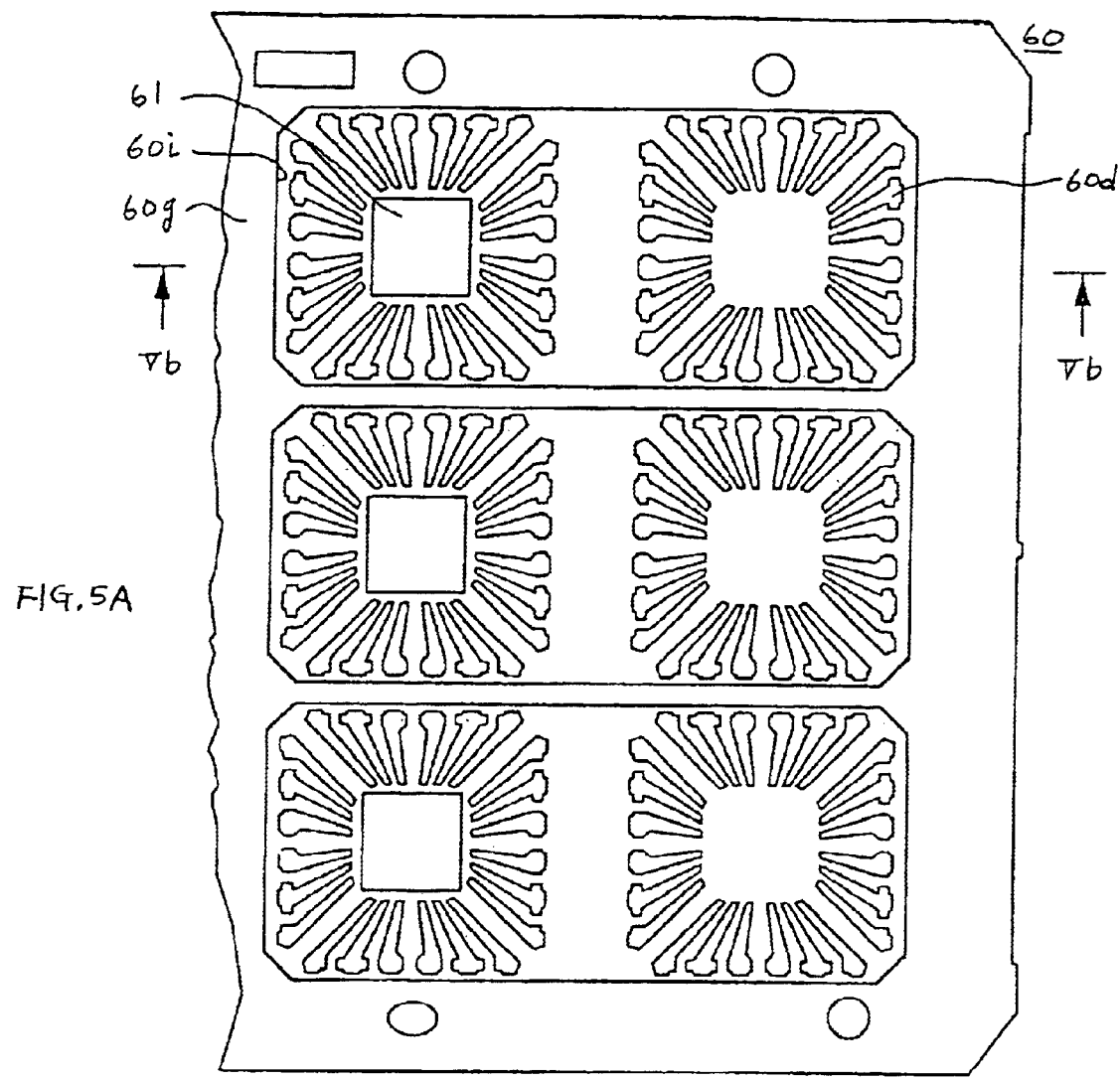
FIG. 5A is a plan view of the lead frame used as a further wiring base member according to the first preferred embodiment of the present invention.

To obtain a so-called multi-chip-package semiconductor device in which a semiconductor chip for power with a high heating value and another semiconductor chip with a small heating value are simultaneously sealed with one resin, as shown in FIGS. 5A. 5B, it is also preferable that a radiation member 61 be provided in the region where the semiconductor chip for power of a high heating value is mounted. In such a modification, the same function and advantage as the foregoing are also exhibited.

Figure 5B:
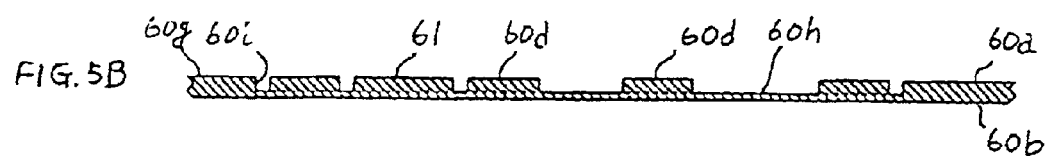
FIG. 5B is a sectional view taken along the line Vb—Vb indicated by the arrows shown in FIG. 5A.

Note that the same reference numerals shown in FIGS. 1 and 2 are designated to like parts shown in FIGS. 4 and 5, and any further description thereof is omitted herein.

Figure 6:
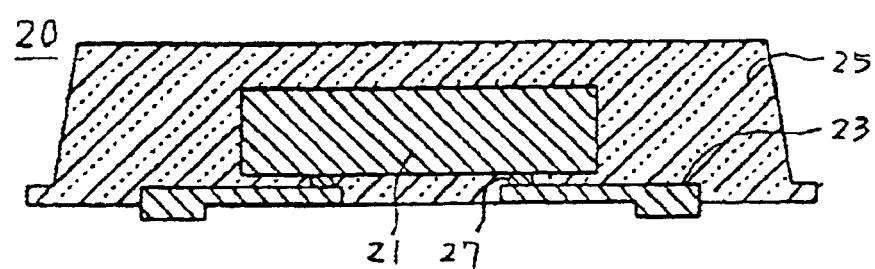
FIG. 6 is a sectional view showing another construction of a semiconductor device according to the first preferred embodiment of the present invention.

Though the electrical connection between the semiconductor chip 21 and the lead electrodes 23 is made through the connecting lead 24 composed of a gold wire, aluminum wire or the like in this embodiment, it is also possible that, the semiconductor chip 21 and the lead electrodes 23 are connected through a connecting member called inner bump such as Au bump, solder bump, etc. by directing the surface of the semiconductor chip 21 downward as shown in FIG. 6. In such a modification, the same function and advantage as the foregoing are also exhibited. In this modification, as the junction member 22 for joining the semiconductor chip 21 can be omitted, curvature of the semiconductor device due to difference in coefficient of linear expansion is reduced.

Figure 7:
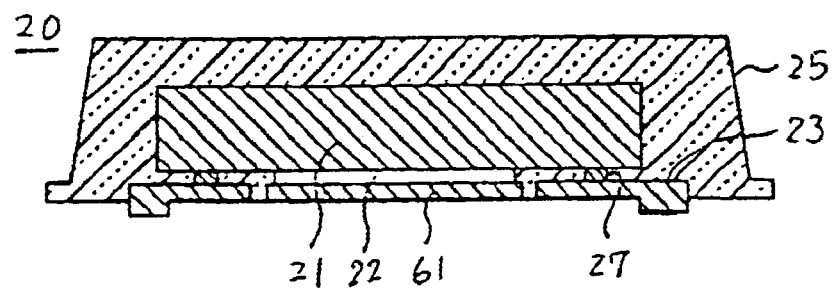
FIG. 7 is a sectional view showing a further construction of a semiconductor device according to the first preferred embodiment of the present invention.

In the event that heating value of the semiconductor chip 21 is large, it is preferable that the radiation member 61 is fitted to the junction material 22 as shown in FIG. 7. In such a modification, the same function and advantage as the foregoing are also exhibited.

A semiconductor device according to the second preferred embodiment of the present invention and a manufacturing method thereof are hereinafter described.

Figure 8A:
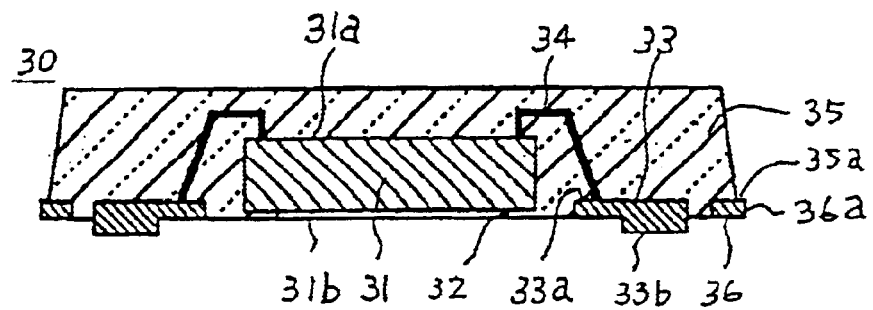
FIG. 8A is a sectional view showing a construction of a semiconductor device according to a second preferred embodiment of the present invention.
Figure 8B:
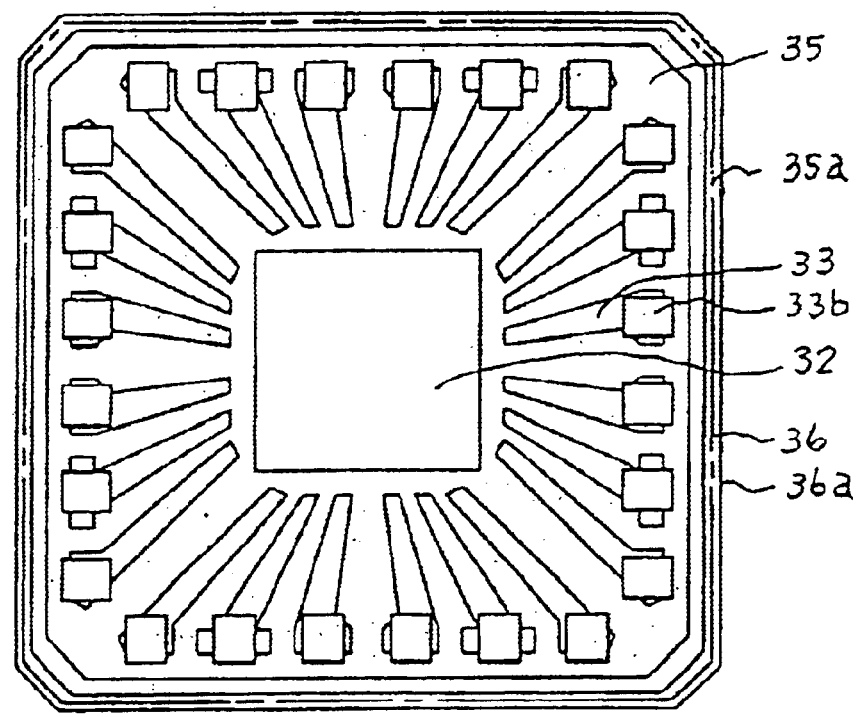
FIG. 8B is a bottom view of the semiconductor device shown in FIG. 8A.
Figures 9A, 9B, 9C:
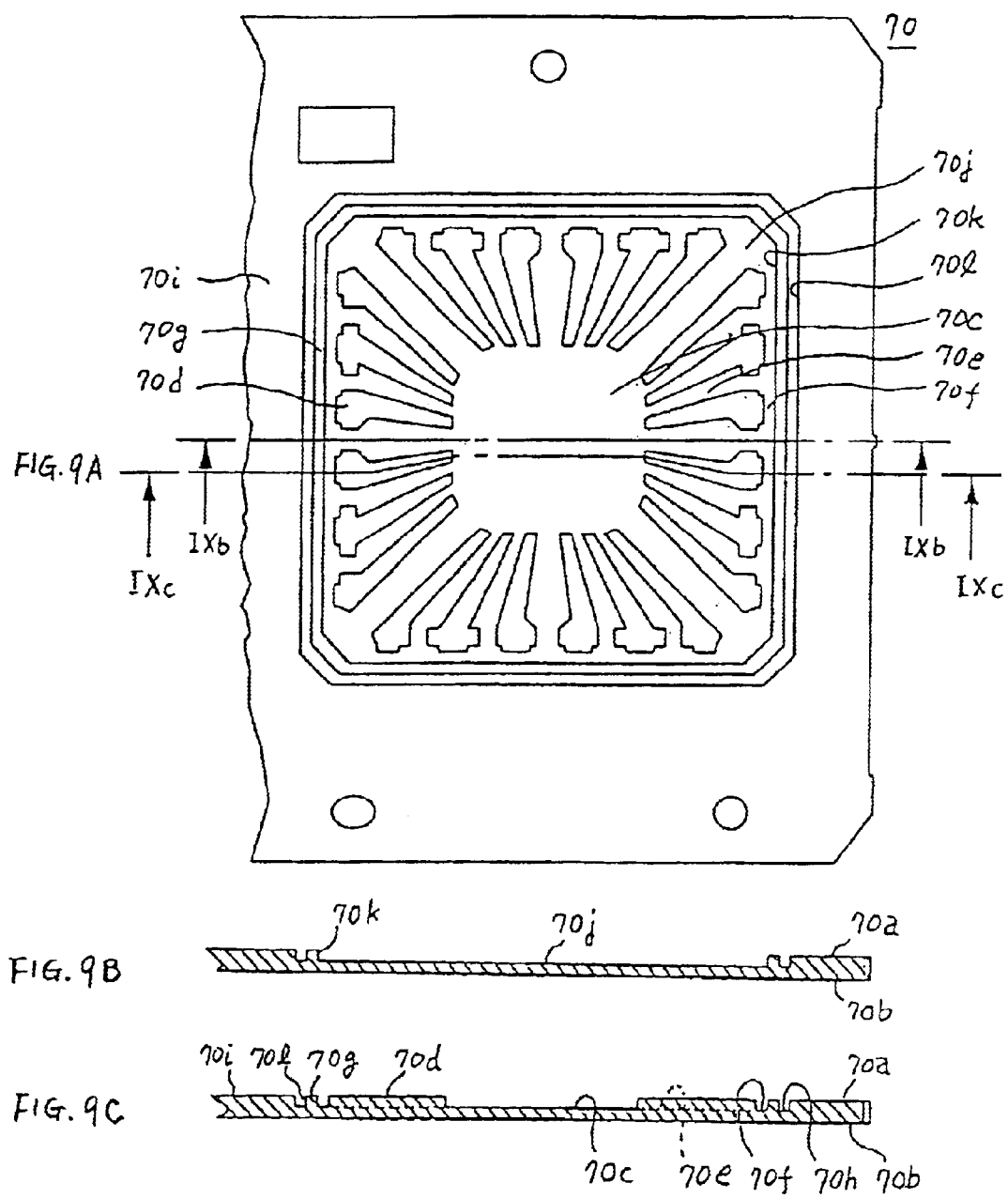
FIG. 9A is a plan view of a lead frame arranged in a single line and used as a wiring base member according to the second preferred embodiment of the present invention.
FIG. 9B is a sectional view taken along the line IXb—IXb indicated by the arrows in FIG. 9A.
FIG. 9C is a sectional view taken along the line IXc—IXc indicated by the arrows in FIG. 9A.

FIG. 8A is a sectional view showing a construction of a semiconductor device according to a second preferred embodiment of the present invention, and FIG. 8B is a bottom view of the semiconductor device shown in FIG. 8A. FIG. 9A is a plan view of a lead frame arranged in a single line and used as a wiring base member according to the second preferred embodiment of the present invention. FIG. 9B is a sectional view taken along the line IXb—IXb indicated by the arrows in FIG. 9A. FIG. 9C is a sectional view taken along the line IXc—IXc indicated by the arrows in FIG. 9A.

Configuration of the lead frame 70 is hereinafter described. As shown in FIGS. 9A, 9B and 9C, the lead frame 70 composed of a plate-like body having an uneven upper-surface 70a and a plain under surface 70b. This plate-like body includes a first thin portion 70c for mounting a semiconductor chip 31 provided with a plurality of pad electrodes, a plurality of first thick portions 70d provided around the first thin portion 70c for forming lead electrodes 33 respectively arranged corresponding to the pad electrodes of the semiconductor chip 31, a second thin portion 70e provided between one of the plurality of first thick portions 70d and another, a third thin portion 70f provided for surrounding the plurality of first thick portions 70d, a second thick portion 70g provided around the third thin portion 70f to form an auxiliary electrode 36, a fourth thin portion 70h provided around the second thick portion 70g, and a third thick portion 70i provided around the fourth thin portion 70h.

Further, the first thin portion 70c, the second thin portion 70e, the third thin portion 70f and the fourth thin portion 70h have substantially the same thickness. Those thin portions 70c, 70e, and 70f form a concave part 70j having a peripheral portion 70k. The thick portions 70d, 70g and 70i form a projecting part.

Using such a lead frame 70, a semiconductor device 30 shown in FIGS. 8A and 8B is obtained. The semiconductor device 30 has an upper surface 31a and an under surface 31b, and in which the semiconductor chip 31 having the plurality of pad electrodes not shown is mounted on the first thin portion 70c of the lead frame 70 not shown through a junction material 32. The plurality of lead electrodes 33 extending peripherally on the under surface 31b side of the semiconductor chip 31 are arranged corresponding to the plurality of pad electrodes. A connecting lead 34 serving as connecting means makes a connection between the plurality of pad electrodes and the plurality of lead electrodes 33. Each of the plurality of lead electrodes 33 includes a thin internal lead portion 33a having a connection part to the connecting lead 34 on the upper surface side, and a thick external electrode portion 33b protruding toward the under surface and forming a connection part to outside. The auxiliary electrode 36 provided around the plurality of lead electrodes 33 is connected to the lead electrodes 33 or to the pad electrodes through a connecting member not shown. This auxiliary electrode is used in power source layer, grounding layer, neutral layer, etc., when required.

The semiconductor chip 31, the lead electrodes 33, the connecting lead 34 and the auxiliary electrode 36 are integrally sealed with a seal resin layer 35. This seal resin layer 35 has an underside which forms substantially the same surface as the under surface of the internal lead portion 33a of the lead electrodes 33 and that of the auxiliary electrode 36. The external electrode portion 33b protrudes downward from the underside of the seal resin layer 35. In the case of BGA type semiconductor device, a conductive ball not shown is mounted on the external electrode portion 33b.

In the lead frame 70 not shown, the thin portion of the lead frame is removed by etching as described hereinafter, and finally the lead frame 70 is separated at the peripheral portion 701 of the second thick portion 70g provided for forming the auxiliary electrode 36. Thus, the semiconductor device 30 shown in FIGS. 8A and 8B is obtained.

Figure 10A:
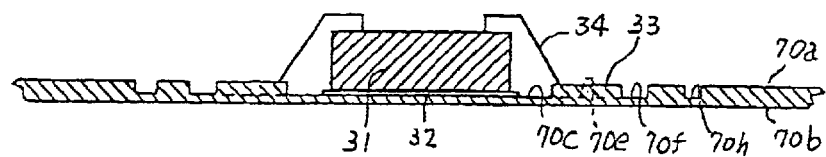
FIGS. 10A to 10D are explanatory views showing a manufacturing method of the semiconductor device according to the second preferred embodiment of the present invention.
Figure 10B:
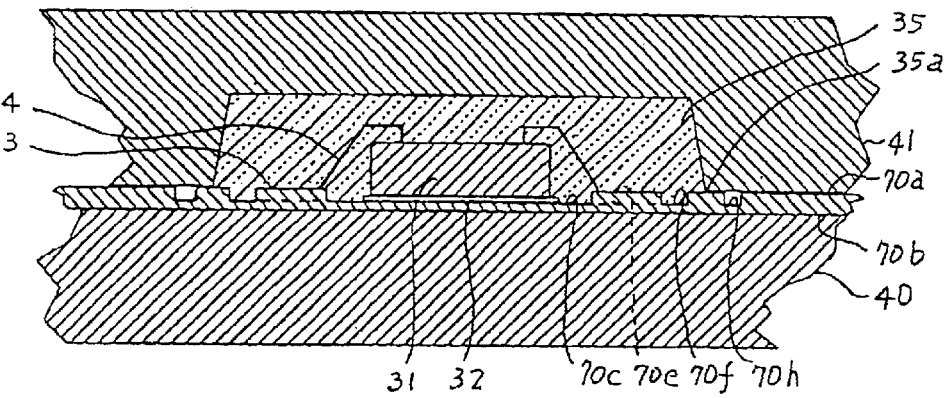
Figure 10C:
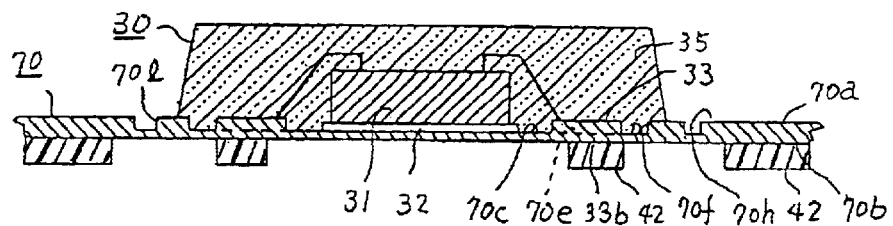
Figure 10D:
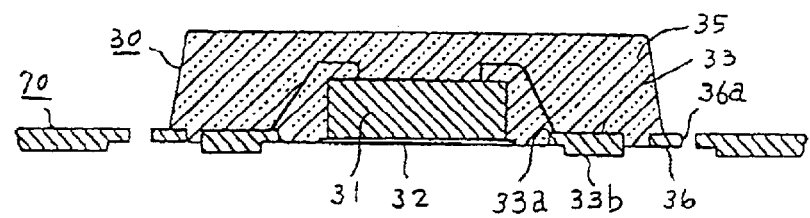
Figure 11A:
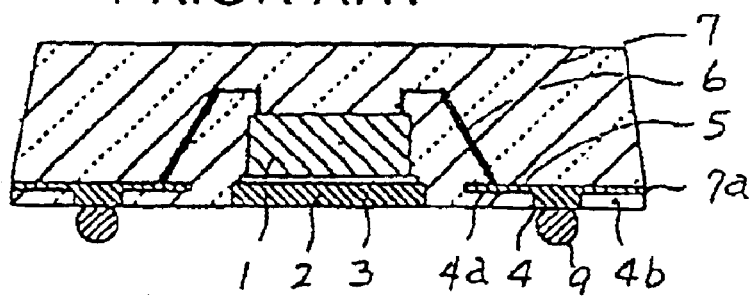
FIG. 11A is a sectional view showing a construction of a conventional BGA type semiconductor device.
Figure 11B:
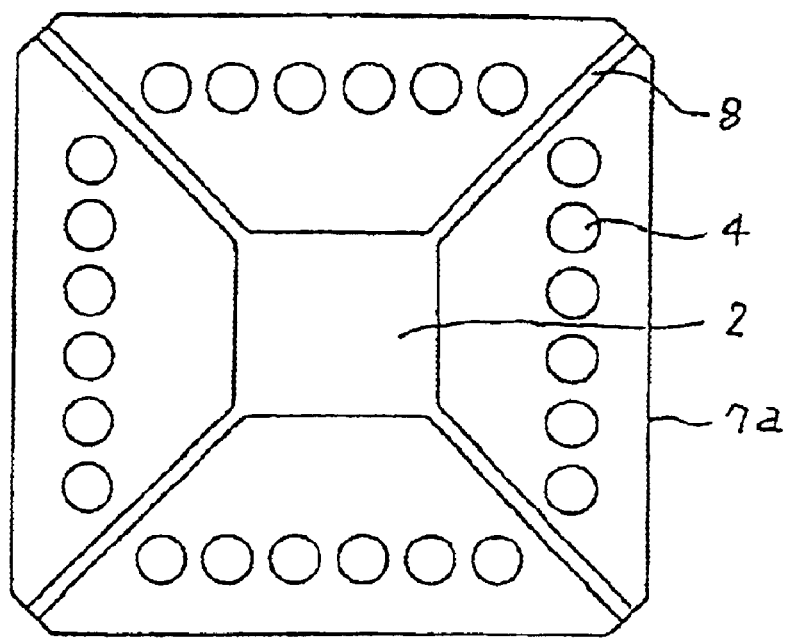
FIG. 11B is a bottom view of the semiconductor device shown in FIG. 11A.
Figure 12A:
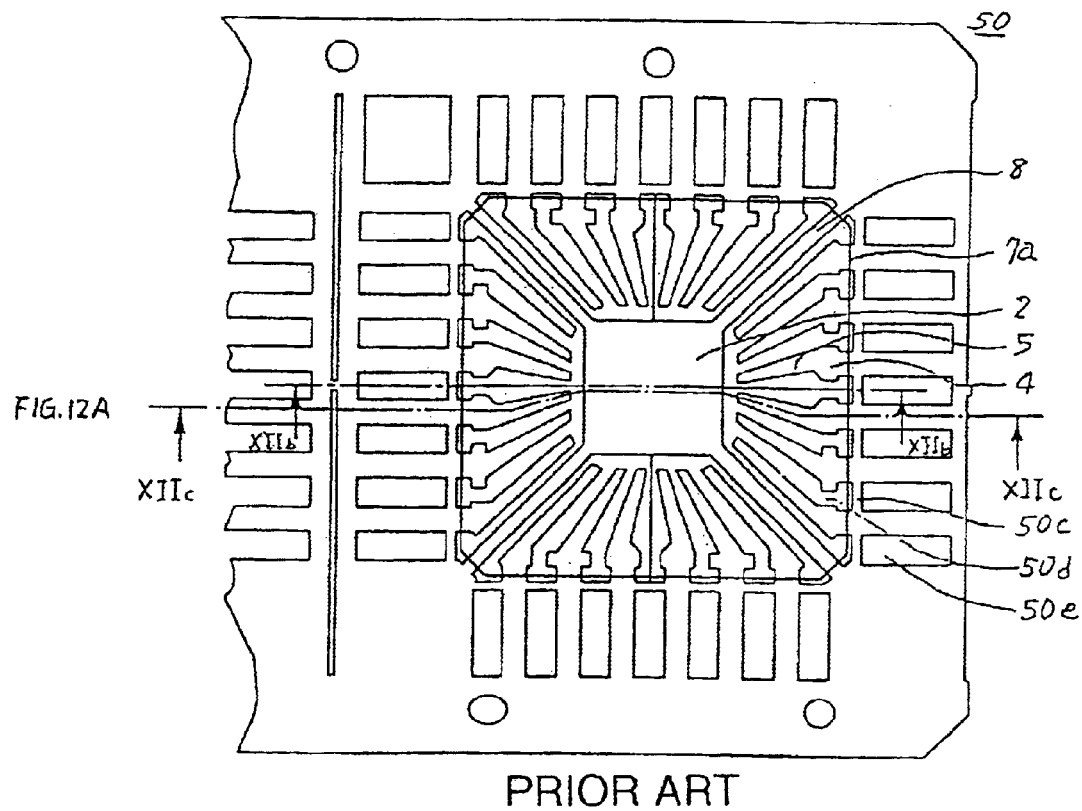
FIG. 12A is a plan view showing a lead frame used in the conventional BGA type semiconductor device and arranged in a single line.
Figure 12B:
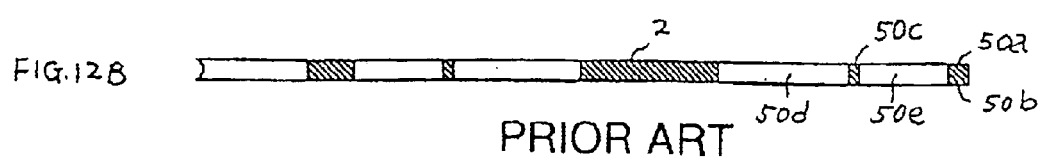
FIG. 12B is a sectional view taken along the line XIIb—XIIb indicated by the arrows in FIG. 12A.
Figure 12C:
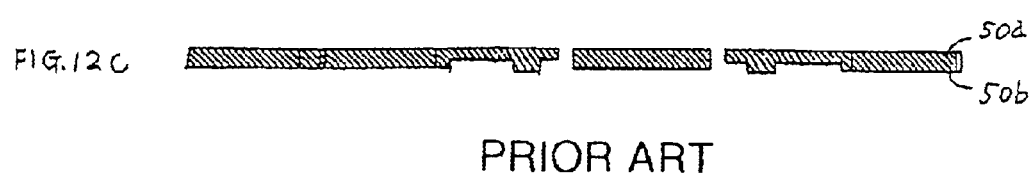
FIG. 12C is a sectional view taken along the line XIIc—XIIc indicated by the arrows in FIG. 12A.
Figure 13A:
FIGS. 13A to 13C are explanatory views showing a manufacturing method of the conventional BGA type semiconductor device.
Figure 13B:
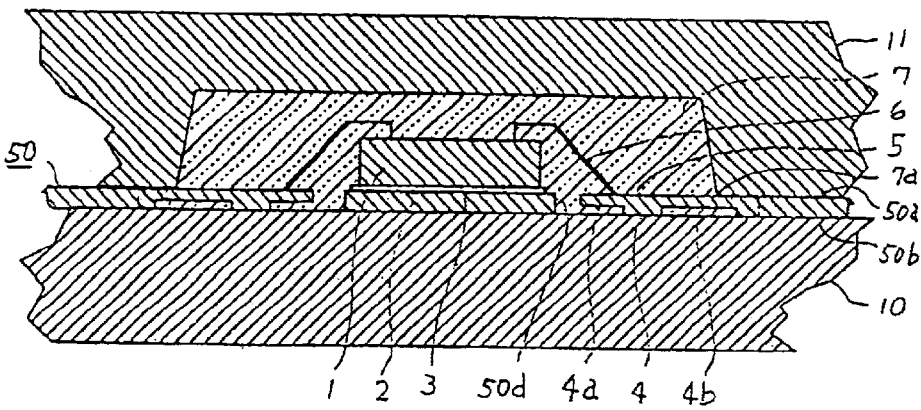
Figure 13C:
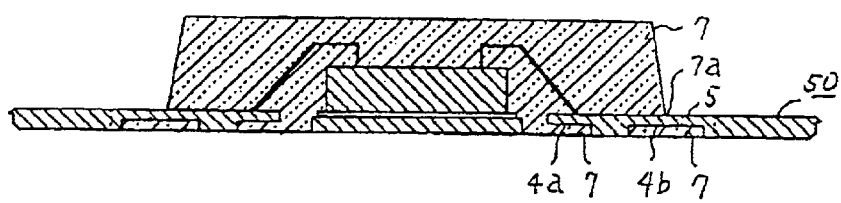

Now, a method of manufacturing the semiconductor device is described with reference to FIGS. 8 to 10. FIGS. 10A to 10D are explanatory views showing a manufacturing method of the semiconductor device according to the second preferred embodiment of the present invention. FIG. 10A is a sectional view showing a state that a semiconductor chip mounted on the lead frame formed with a thin portion, a lead electrode and an auxiliary electrode is electrically connected to the lead electrode. FIG. 10B is a sectional view showing a state that an upper mold and a lower mold are applied to seal with a resin layer. FIG. 10C is a sectional view showing a state that a resist film for etching is applied to form an external electrode portion. FIG. 10D is a sectional view showing a state that the external electrode portion is protruded by etching.

First, by applying a half etching to the upper surface 70a of the lead frame 70, after forming a resist film not shown and patterning it as shown in FIG. 9A, a plate-like body provided with the uneven upper surface 70a and the plain under surface 70b is formed. More specifically, the first thin portion 70c for mounting the semiconductor chip 31 provided with the plurality of pad electrodes not shown, the plurality of first thick portions 70d provided around the first thin portion 70c for forming the lead electrodes 33 respectively arranged corresponding to the pad electrodes of the semiconductor chip 31, the second thin portion 70e provided between one of the plurality of first thick portions 70d and another, the third thin portion 70f provided for surrounding the plurality of first thick portions 70d, the second thick portion 70g provided around the third thin portion 70f to form the auxiliary electrode 36, the fourth thin portion 70h provided around the second thick portion 70g, and the third thick portion 70i provided around the fourth thin portion 70h are formed.

Further, the first thin portion 70c, the second thin portion 70e, the third thin portion 70f and the fourth thin portion 70h have substantially the same thickness. Those thin portions 70c, 70e, 70f and 70h form a concave part 70j. The thick portions 70d, 70g and 70i form a projecting part.

The peripheral portion 36a of the auxiliary electrode 36 is formed either to be larger than a resin seal line 35a, for example, to be larger by a depth of the concave part 70j or to be coincident with the resin seal line 35a, so that a later-described upper mold 41 is easily positioned.

Then, as shown in FIG. 10A, by applying a junction material 32 composed of epoxy resin, epoxy resin with silver, adhesive tape, solder or the like to the central part of the first thin portion 70c, the semiconductor chip 31 is put together (junction step).

Thereafter, the semiconductor chip 31 is connected to the lead electrodes 33 using the connecting lead 34 composed of gold wire, aluminum wire or the like (connection step).

Then, as shown in FIG. 10B, the under surface 70b of the lead frame 70 of which junction step and connection step have been completed is mounted on the lower mold 40. Then, the upper mold 41 is positioned to the resin seal line 35a and mounted on the upper surface 70a of the lead frame 70. After tightening the two molds 40 and 41, the thermosetting seal resin layer 35 composed of epoxy resin, phenol resin or the like is transformed to a liquid of a low viscosity and injected with a high pressure by transfer molding (sealing step).

At this time, the under surface 70b side of the lead frame 70 being integrated with the thin portions 70c, 70e, 70f and 70h comes entirely in contact with the lower mold 40, and the seal resin layer 35 is shut off by the thin portions 70c, 70e, 70f and 70h. Therefore, the seal rein layer 35 does not flow in the contact surface between the under surface 70b of the lead frame 70 and the lower mold 70. As a result, it is possible to prevent a formation of thin burr.

After the sealing step, the two molds 40 and 41 are removed. And as shown in FIG. 10C, on the under surface 70b of the lead frame 70, a masking with a resist film 42 is applied to a part where the external electrode portion 33b is formed and to a part surrounding the outside of the fourth thin portion 70h. Then, the under surface 70b of the lead frame 70 except the portions applied with the resin film 32, is removed by half etching up to the same surface as the under surface of the seal resin layer 35. As a result, as shown in FIG. 10D, the junction material 32 is exposed, and the plurality of lead electrodes 33 protrude respectively toward the under surface. Thus, the thick external electrode portion 33b serving as a connection part to outside is formed on the underside of the lead electrodes 33 (formation step of external electrode portion).

That is, the semiconductor chip 31, the lead electrodes 33 and the connecting lead 34 are integrally sealed with the seal resin layer 35. This seal resin layer 35 is arranged so that its underside forms substantially the same surface as the under surface of the internal lead portion 33a of the lead electrodes 33 and that of the auxiliary electrode 36, and the external electrode portion 33b protrudes downward from the underside of the seal resin layer 35. The lead frame 70 and the semiconductor device 30 are connected at the area where the peripheral portion 36a of the auxiliary electrode 36 is located. Thus, the semiconductor device 30 is inevitably separated from the lead frame 70 (separation step).

As a result, it is possible to separate easily the semiconductor device 30 and the lead frame 70 without using any cutter, and it is further possible to prevent the separated portion of the seal resin layer 35 of the semiconductor device 30 from being a complicated crushed configuration.

Even if the seal resin layer 35 gets out of the resin seal line 35a of the upper mold 41 to the surface of the auxiliary electrode 36 and a thin burr is formed there, any further leakage is inhibited at the peripheral portion 36a of the auxiliary electrode 36, and there is no drop of the burr. As a result, a semiconductor device of high quality can be achieved, and it is possible for the auxiliary electrode 36 to protect the periphery of the under surface of the semiconductor device 30.

Further, the semiconductor device obtained after this separation step can be built in a thin and small apparatus such as cellular phone to serve as a non lead type semiconductor device.

Further, before the separation step, a soldering paste not shown is applied to the external electrode portion 33b not shown to connect a conductive ball not shown such as soldering ball. Thereafter, the semiconductor device 30 is separated from the lead frame 70 at the peripheral portion 36a of the auxiliary electrode 36. Since semiconductor device 30 is separated from the lead frame 70, it is also possible to obtain a BGA type semiconductor.

On the under surface side of the semiconductor device 30, the external electrode 33b protrudes downward from the underside of the seal resin layer. Therefore, even if a curvature is produced due to difference in coefficient of thermal expansion of the components of the semiconductor device, it is possible to obtain a desirable contact surface in the electrical connection between the external electrode portion 33b and other board.

Even if there is a curvature in the other board in addition to the curvature produced in the semiconductor device 30 itself, the external electrode portion 33b comes exactly in contact with the other board without fail, and there is no insufficient contact.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising:

using a lead frame including a plate-like body having non-planar upper surface and a planar under surface, a first thin portion for mounting a semiconductor chip and having a plurality of pad electrodes, a plurality of first thick portions radially arranged in said first thin portion for forming lead electrodes respectively corresponding to the pad electrodes of the semiconductor chip, a second thin portion located between pairs of said plurality of first thick portions, a third thin portion peripherally surrounding said plurality of first thick portions, and a second thick portion surrounding said third thin portion;

sealing integrally the semiconductor chip, and said lead electrodes to the same surface as all of said first, second, and third thin portions with a resin, after making a connection between said plurality of pad electrodes of the semiconductor chip mounted on said first thin portion and said plurality of lead electrodes with connecting means; and removing said first, second, and third thin portions by etching so that each of said plurality of lead electrodes includes a thin internal lead portion having a connection part on an upper surface side and a thick external electrode portion protruding toward an under surface and forming a connection part, wherein said resin has an underside substantially co-planar with the under surface of the internal lead portion of said lead electrodes, and so that said external electrode portion protrudes outward from the underside of said resin.

2. The method of manufacturing a semiconductor device according to claim 1, wherein the first, second, and third thin portions have substantially the same thickness.

3. A method of manufacturing a semiconductor device comprising:

using a lead frame including a plate-like body having non-planar upper surface and a planar under surface, a first thin portion for mounting a semiconductor chip and having a plurality of pad electrodes, a plurality of first thick portions radially arranged in said first thin portion for forming lead electrodes respectively corresponding to the pad electrodes of the semiconductor chip, a second thin portion located between pairs of said plurality of first thick portions, a third thin portion peripherally surrounding said plurality of first thick portions, a second thick portion surrounding said third thin portion to form an auxiliary electrode, a fourth thin portion surrounding said second thick portion, and a third thick portion surrounding said fourth thin portion;

sealing integrally the semiconductor chip, said lead electrodes, and said auxiliary electrode to the same surface as all of said first, second, third, and fourth thin portions with a resin, after making a connection between said plurality of pad electrodes of said semiconductor chip mounted on said first thin portion and said plurality of lead electrodes with connecting means and making a connection between said lead electrodes and said auxiliary electrode; and removing said first, second, third and fourth thin portions by etching so that each of said plurality of lead electrodes includes a thin internal lead portion having a connection part on an upper surface side and a thick external electrode portion protruding toward an under surface and forming a connection part, wherein said resin has an underside substantially co-planar with the under surface of the internal lead portion of said lead electrodes and said auxiliary electrode, and so that said external electrode portion protrudes outward from the underside of said seal resin.

4. The method of manufacturing a semiconductor device according to claim 3, wherein the first, second, third, and fourth thin portions have substantially the same thickness.

* * * * *